United States Patent
Ahuja et al.

(10) Patent No.: US 9,646,910 B2
(45) Date of Patent: *May 9, 2017

(54) INTEGRATED HEAT SPREADER THAT MAXIMIZES HEAT TRANSFER FROM A MULTI-CHIP PACKAGE

(71) Applicant: INTEL CORPORATION, Santa Clara, CA (US)

(72) Inventors: Sandeep Ahuja, University Place, WA (US); Eric W. Buddrius, Lacey, WA (US); Roger D. Flynn, Tempe, AZ (US); Rajat Agarwal, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/019,931

(22) Filed: Feb. 9, 2016

(65) Prior Publication Data

US 2016/0155682 A1 Jun. 2, 2016

Related U.S. Application Data

(63) Continuation of application No. 13/535,257, filed on Jun. 27, 2012, now Pat. No. 9,257,364.

(51) Int. Cl.
*H05K 7/20* (2006.01)
*H05K 13/00* (2006.01)
(Continued)

(52) U.S. Cl.
CPC ............... *H01L 23/36* (2013.01); *G06F 1/20* (2013.01); *H01L 21/4882* (2013.01);
(Continued)

(58) Field of Classification Search
CPC .......... H01L 2023/405; H01L 23/34–23/4735; H01L 2924/00; H05K 2201/10734;
(Continued)

(56) References Cited

U.S. PATENT DOCUMENTS 6,252,774 B1 * 6/2001 Rife .................... H01L 23/3675
257/727
2005/0180113 A1 * 8/2005 Shirakami ............. H01L 23/373
361/704

(Continued)

FOREIGN PATENT DOCUMENTS

KR 10-2004-0071067 8/2004

OTHER PUBLICATIONS

PCT International Preliminary Report on Patentability and Written Opinion for Application No. PCT/US2013/043760, mailed Dec. 31, 2014, (6 pages).

(Continued)

*Primary Examiner* — Courtney Smith
*Assistant Examiner* — Michael Matey
(74) *Attorney, Agent, or Firm* — Blakely, Sokoloff, Taylor & Zafman LLP

(57) ABSTRACT

In at least some embodiments, an electronic package to maximize heat transfer comprises a plurality of components on a substrate. A stiffener plate is installed over the components. The stiffener plate has openings to expose the components. A plurality of individual integrated heat spreaders are installed within the openings over the components. A first thermal interface material layer (TIM1) is deposited between the components and the plurality of individual integrated heat spreaders. In at least some embodiments, the thickness of the TIM1 is minimized for the components.

21 Claims, 10 Drawing Sheets

(51) Int. Cl.
*G06F 1/20* (2006.01)
*H01L 23/36* (2006.01)
*H01L 23/433* (2006.01)
*H01L 21/48* (2006.01)
*H01L 25/065* (2006.01)
*H01L 25/00* (2006.01)

(52) U.S. Cl.
CPC ........ *H01L 23/433* (2013.01); *H01L 25/0655* (2013.01); *H01L 25/50* (2013.01); *H01L 2224/16225* (2013.01); *H01L 2224/32225* (2013.01); *H01L 2224/73204* (2013.01); *H01L 2224/73253* (2013.01); *H05K 7/20445* (2013.01); *Y10T 29/49002* (2015.01)

(58) Field of Classification Search
CPC ... H05K 7/20–7/2099; G06F 2200/201; G06F 1/18; G06F 2217/40; G06F 1/20
See application file for complete search history.

(56) References Cited

U.S. PATENT DOCUMENTS

| | | |
|---|---|---|
| 2005/0230797 A1 | 10/2005 | Ho et al. |
| 2006/0249852 A1 | 11/2006 | Chiu et al. |
| 2007/0084856 A1* | 4/2007 | DeBonis ................ H05B 6/105 219/603 |
| 2007/0132072 A1 | 6/2007 | Chang |
| 2011/0241161 A1 | 10/2011 | Tosaya et al. |

OTHER PUBLICATIONS

International Application No. PCT/US2013/043760, International Search Report, mailed Aug. 27, 2013, 3 pages.

* cited by examiner

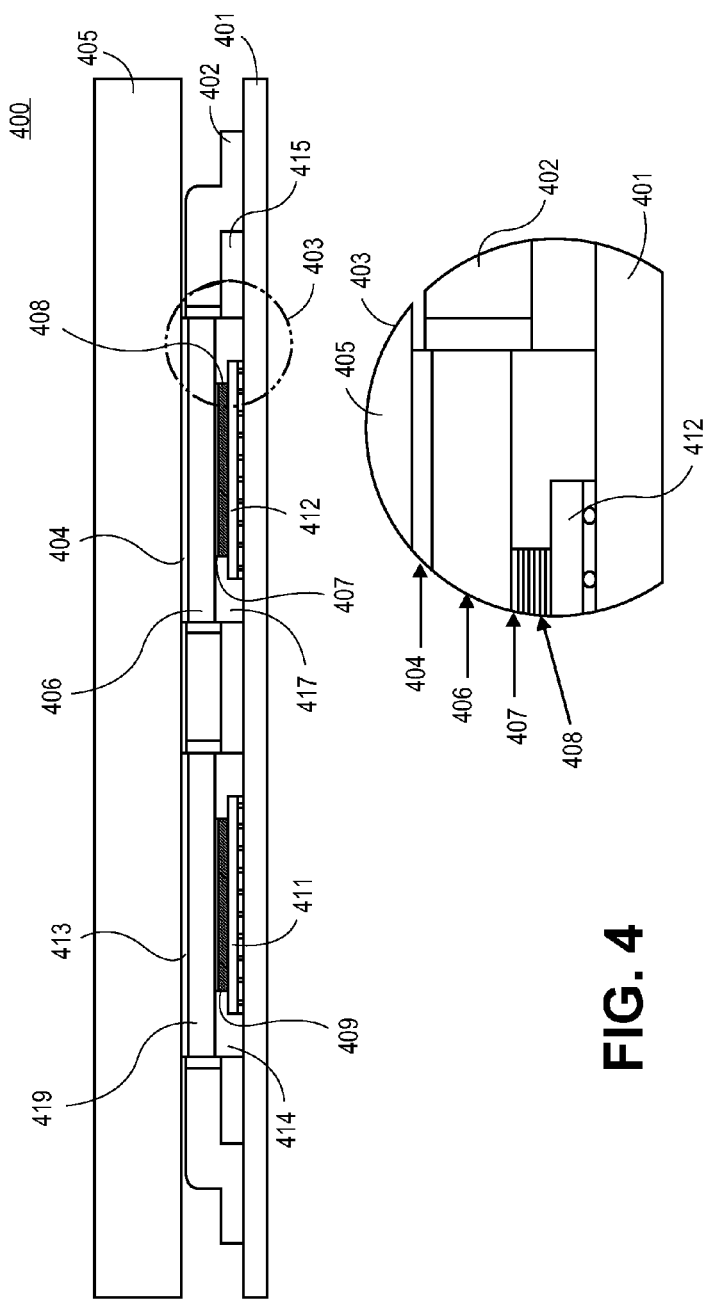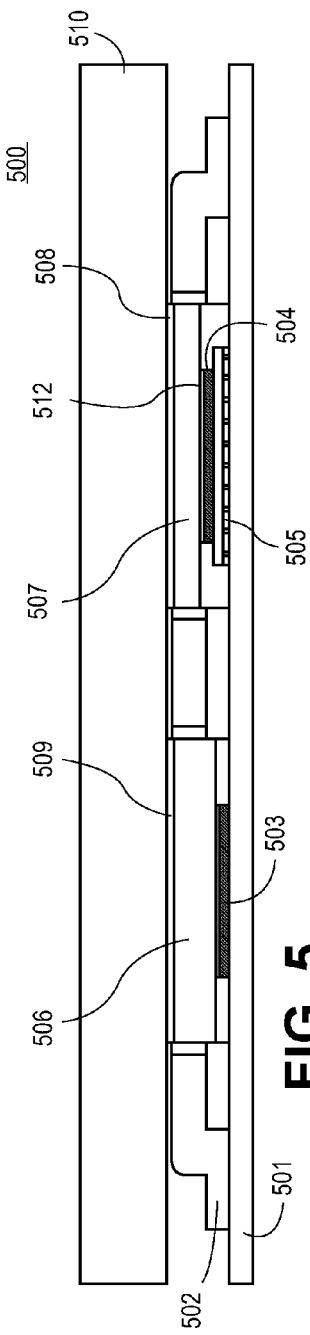
FIG. 4
FIG. 5

INTEGRATED HEAT SPREADER THAT MAXIMIZES HEAT TRANSFER FROM A MULTI-CHIP PACKAGE

CLAIM OF PRIORITY

The present application is a continuation of co-pending U.S. patent application Ser. No. 13/535,257, filed Jun. 27, 2012, titled "An Integrated Heat Spreader that Maximizes Heat Transfer from a Multi-Chip Package," and claims a priority benefit thereof.

TECHNICAL FIELD

Embodiments as described herein relate to the field of electronic systems manufacturing, and in particular, to an electronic system assembly.

BACKGROUND ART

A multi-chip package (MCP) generally refers to an electronic package where multiple components, e.g., integrated circuits (ICs), semiconductor dies or other discrete components are packaged onto a unifying substrate. The MCP is an important facet of modern electronic miniaturization and micro-electronic systems.

A relatively new aspect of the MCP technology development is a "chip-stack" packaging. The chip-stack packaging allows the die blocks to be stacked in a vertical configuration making the resultant MCP footprint significantly smaller. Because area size is greatly valued in miniature electronics designs, the chip-stack is an attractive option in many applications, for example, cell phones and personal digital assistants (PDAs).

One of the challenges of the MCP technology is that the height of the components varies. The height variation further increases for the stacked dies. Currently, the height variation is absorbed by the first level thermal interface material (TIM1) that is applied between a die and an integrated heat spreader.

Generally, the TIMs are thermally conductive materials, which are applied across jointed solid surfaces to increase thermal transfer efficiency. The TIM1s are applied between the die and the integrated heat spreader to lower package thermal resistance.

FIG. 1A is a cross-sectional view 100 of a typical MCP having components with the same nominal height. As shown in FIG. 1A, a component 103 and a component 104 are on a substrate 101. Components 103 and 104 have the same nominal height. An integrated heat spreader (IHS) 102 is attached to a substrate 101 above component 103 and component 104. As shown in FIG. 1A, a first level thermal interface material (TIM1) 105 is applied between the die of the component 104 and IHS 102. A TIM1 106 is applied between die of the component 103 and IHS 102.

Although the components in the MCP can have the same nominal height, there is natural height variation across the components. As shown in FIG. 1A, the die height of the component 104 is greater than the die height of the component 103. As shown in FIG. 1A, TIM1 106 is thicker than TIM1 105 to compensate for the die height difference.

FIG. 1B is a cross-sectional view 120 of a typical MCP having components with different nominal heights. As shown in FIG. 1B, a component 113 represents a die mounted on a substrate 110 via a ball grid array (BGA) assembly 111. A component 114 represents a die directly attached to substrate 110. The nominal height of component 113 is greater than the nominal height of the component 114. An IHS 112 is attached to a substrate 110 above component 113 and component 114. As shown in FIG. 1B, a TIM1 116 is applied between the component 113 and IHS 112. A TIM1 115 is applied between component 114 and IHS 112. As shown in FIG. 1B, TIM1 115 is thicker than TIM1 116 to compensate for lower height of the component 114.

That is, compensation for the height variation occurs at the expense of increasing the thickness of the TIM1 between the die and the integrated heat spreader. However, thicker TIM1 bond line hurts thermal performance of the MCP that leads to limited bandwidth, frequency, greater power leakage, and the like. Additionally, absorbing the height variation by the TIM1 limits choice of TIM1 materials.

Reduction in cooling capacity of the TIM1 significantly impacts an electronic system performance and significantly increases the risk of the component failure. As power consumed by the MCP modules and the number of the components in the modules increase, the risk of the component failure caused by the reduction of the cooling capacity of the TIM1 further increases.

BRIEF DESCRIPTION OF THE DRAWINGS

FIG. 4 is a cross-sectional view of a MC package according to one embodiment.

FIG. 5 is a cross-sectional view of a MC package according to one embodiment.

DESCRIPTION OF THE EMBODIMENTS

Figure 1A:
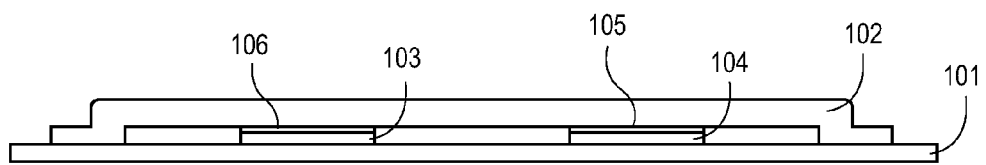
FIG. 1A is a cross-sectional view of a typical MCP having components with the same nominal height.
Figure 1B:
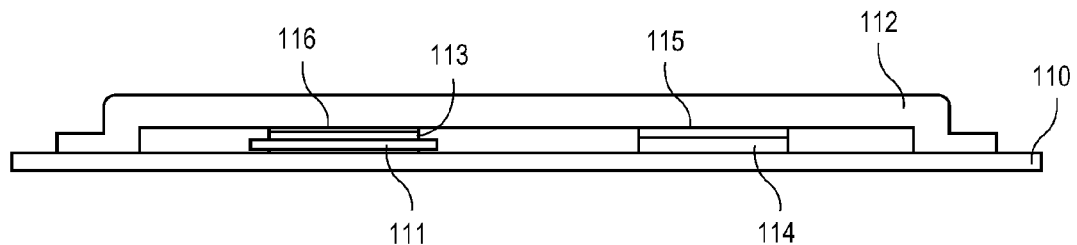
FIG. 1B is a cross-sectional view of a typical MCP having components with different nominal heights.

In the following description, numerous specific details, such as specific materials, dimensions of the elements, etc. are set forth in order to provide thorough understanding of one or more of the embodiments as described herein. It will be apparent, however, to one of ordinary skill in the art that the one or more embodiments as described herein may be practiced without these specific details. In other instances, semiconductor fabrication processes, techniques, materials, equipment, etc., have not been described in great detail to avoid unnecessary obscuring of this description.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Multi-chip packages (MCPs) are becoming more and more of a reality as more and more components are integrated into a MCP. MCPs can include a memory integrated on a central processing unit (CPU) package. Further, Network Interface Controller (NIC) and router capabilities can be integrated on the CPU package. Further, Platform Control Hub (PCH) and IO Hub (IOH) can be integrated on the CPU package. The CPU package can include a memory stacked on top of a CPU die. As the CPU die becomes smaller, blocks of the CPU and memory stacks can be arranged in an MCP fashion on the CPU package substrate.

Need for MCP packages can be driven by increasing core count beyond what is achievable in a full reticle die. MCP packages can be driven as a Graphics Processing Unit (GPU), a platform controller hub (PCH), peripheral component interconnect express (PCIe) Gen4, fabric, and other electronic components are integrated on the CPU package. Further, a MCP can have a stacked component (e.g., a stack of die blocks) and a non-stacked component (e.g., a die). The height of the stacked component and non-stacked component of the MCP can vary significantly.

The current technique of absorbing the height variation between the components within the MCP by the TIM1 can hurt the thermal performance of the TIM1. For example, increasing the thickness of the TIM1 over a memory to compensate for the height difference of the components can result in about 15° C. drop in cooling capability across the TIM1 for a 10 Watt (W) MCP. One cannot afford such high temperature drop across TIM1 in a 3D stack having for example, a memory on top of the CPU die. The 3D stacks are typically high in power and component count.

Methods and apparatuses to provide an integrated heat spreader design that maximizes heat transfer from a multi-chip package are described herein. In at least some embodiments, methods and apparatuses as described herein address stack height variation without affecting the TIM1 thermal performance. In at least some embodiments, an electronic package to maximize heat transfer comprises a plurality of components on a substrate. A stiffener plate is installed over the components. The stiffener plate has openings to expose the components. A plurality of individual integrated heat spreaders are installed within the openings over the components. A first level thermal interface material layer (TIM1) is deposited between the components and the plurality of individual integrated heat spreaders. In at least some embodiments, the thickness of the TIM1 is minimized for the components.

In at least some embodiments, a package level integrated heat spreader (IHS) ("package stiffener plate") has openings (e.g., cavities, holes, or any other opening) above each die on a MCP package. After the stiffener plate is installed on a substrate, each die receives its own individual small IHS (e.g. IHS slug) that attaches to the die via a TIM1 and sits within the opening. This procedure ensures that the TIM1 has a minimum thickness for all dies in the package. The compensation for the height variation across the components of the MCP is moved away from the TIM1 towards an upper layer. In one embodiment, the component height variation is compensated by the individual small IHSs that sit within the openings. In one embodiment, the small IHS slugs that sit within the openings have stack height variation. In one embodiment, the component height variation is compensated by a second level thermal interface material (TIM2) layer applied between the individual small IHS s and a heat sink above. The TIM2 layer is described in further detail below. By moving the absorption of the MCP stack height variation away from TIM1 to an upper layer, the heat spreading capability of the IHS is moved closer to the heat source. The thick TIM2 is positioned further away from the heat source, when the heat has already spread out significantly. Because the heat has already spread out significantly away from the heat source, the temperature drop across TIM2 caused by the thick TIM2 does not significantly affect the thermal performance of the MC package.

Figure 2:
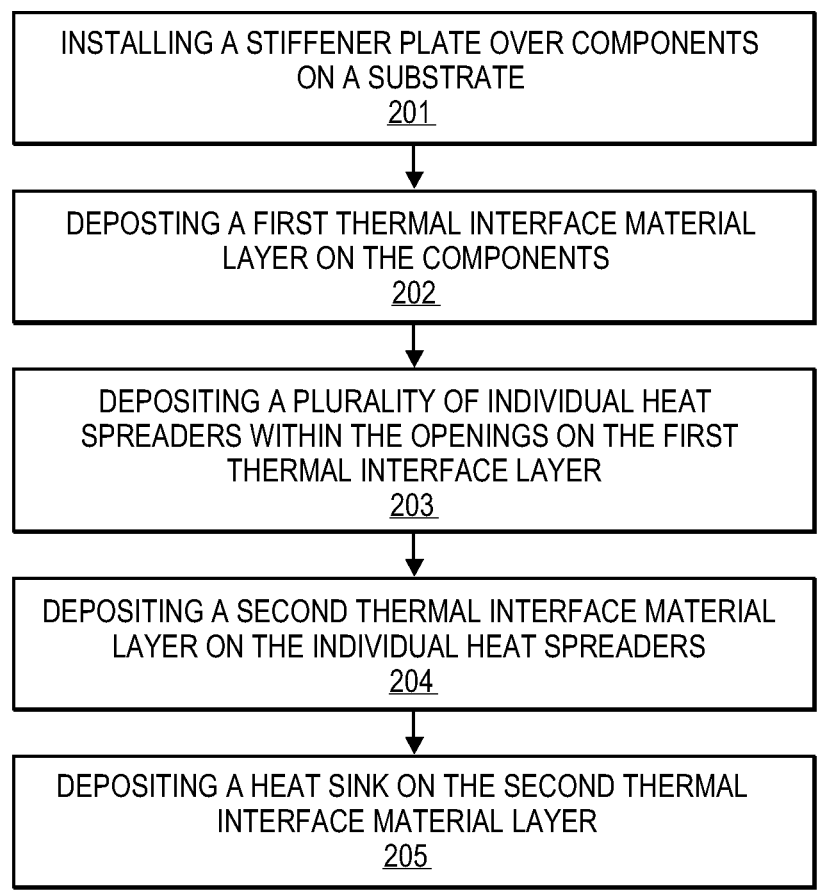
FIG. 2 shows a flowchart of a method to manufacture an integrated circuit device according to one embodiment.

FIG. 2 shows a flowchart of a method 200 to manufacture an integrated circuit device according to one embodiment. At operation 201, a stiffener plate having openings is installed over components on a substrate.

Figure 3A:
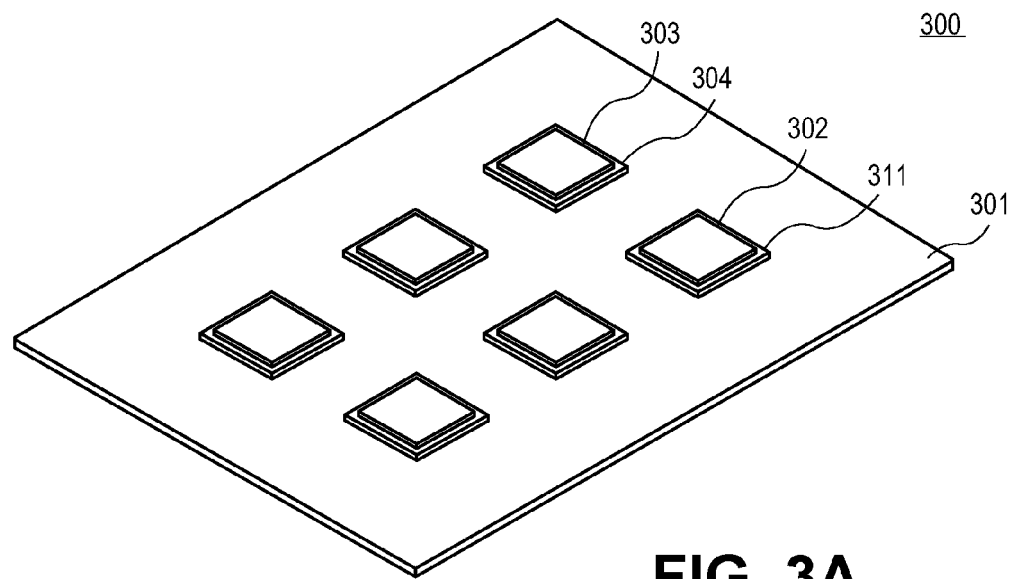
FIG. 3A shows a top view of a multi-chip electronic device package structure according to one embodiment.

FIG. 3A shows a top view of a multi-chip electronic device package structure 300 according to one embodiment. As shown in FIG. 3A, structure 300 includes a plurality of components, such as a component 302 and a component 303 on a substrate 301. As shown in FIG. 3A, component 302 and component 303 are spaced apart from each other on substrate 301. The components, such as components 302 and 303 can have different heights relative to the surface of the substrate. In one embodiment, the height of the components on the substrate is from about 0.2 mm to about 3 mm. In one embodiment, the height difference between the components is up to about 0.5 mm. The difference in heights of the components can be caused by natural variation in die thicknesses across the components. In one embodiment, the nominal height of the components on the substrate is the same. In one embodiment, the nominal height of the components on the substrate is different. In one embodiment, the nominal height difference between the components is up to 1.5 mm.

The components, such as components 302 and 304 can be any one of active and passive electronic device components, such as transistors, memories, capacitors, resistors, optoelectronic devices, switches, interconnects, and any other electronic device components. In one embodiment, the components, such as component 302 and 304, include a memory, a processor, a Platform Controller Hub (PCH), a Peripheral Component Interconnect (PCI), a Graphics Processing Unit (GPU), an on-chip system fabric, a network interface controller, a stacked component, a non-stacked component, a ball grid array (BGA) package, any other electronic component, or any combination thereof. In one embodiment, the components, such as components 302 and 303 include a die. In at least some embodiments, at least one of the components, such as component 302 is a non-stacked die component and at least one of the components, such as component 303 is a stacked die component. In at least some embodiments, at least one of the components, such as at least one of the component 303 and component 302 is a die block. Each die block can be a stacked die package or non-stacked die package.

In at least some embodiments, at least one of the components, such as component 302 is attached to the substrate, such as substrate 301 via a BGA substrate, such as a substrate 311.

Although FIG. 3A illustrates only 6 components, one of ordinary skill in the art of electronic device manufacturing would understand that the number of the die components on the package can be any number greater than one.

Generally, a die in the context of integrated circuits is a small block of semiconducting material, on which a functional circuit is fabricated. Typically, integrated circuits are produced on a wafer of electronic-grade silicon or other semiconductor, for example, Gallium Arsenide ("GaAs") using one of photolithography techniques known to one of ordinary skill in the art of electronic device manufacturing.

The wafer is typically cut ("diced") into many pieces, each containing a copy of the circuit. Each of these pieces can be called a die, or a chip. The die can be mounted on a substrate, such as substrate 301 using, for example, wire bonding, a flip-chip connection, and any other technique known to one of ordinary skill in the art of electronic device manufacturing. The die can be directly attached to the substrate using one of technique known to one of ordinary skill in the art of electronic device manufacturing. In one embodiment, the substrate, such as substrate 301 is a laminated substrate at a bottom side of an electronic device package. The substrate, such as substrate 301 can have conductive traces that route and connect, for example, the die-to-substrate bonds to the substrate-to-ball array bonds. In one embodiment, the substrate, such as substrate 301 includes an organic core, resin, filler material, copper, solder epoxy underfill, solder, or a combination thereof. In at least some embodiments, the substrate, such as substrate 301 is a ceramic substrate.

In one embodiment, the substrate, such as substrate 301 includes a semiconductor material, e.g., monocrystalline silicon ("Si"), germanium ("Ge"), silicon germanium ("SiGe"), a III-V material e.g., gallium arsenide ("GaAs"), or any combination thereof. In one embodiment, the substrate, such as substrate 301 includes metallization interconnect layers for integrated circuits. In at least some embodiments, the substrate, such as substrate 301 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate, such as substrate 301 includes interconnects, for example, vias, configured to connect the metallization layers.

Referring back to FIG. 2, the stiffener plate having the openings is deposited onto the substrate using one of bonding techniques known to one of ordinary skill in the art of electronic device manufacturing. The stiffener plate can be attached to the substrate by one of the seal adhesive thermal interface materials known to one of ordinary skill in the art of electronic device manufacturing. In at least some embodiments, the seal adhesive material is a thermally conductive material. The thermally conductive materials are known to one of ordinary skill in the art of electronic device manufacturing. In at least some embodiments, the stiffener plate is attached to the substrate by soldering. In at least some embodiments, the stiffener plate is a metal plate containing, for example, copper, aluminum, steel, nickel, any other metal, a metal alloy, any other conductive material, or any combination thereof. In one embodiment, the stiffner plate is deposited to expose the components on the substrate, as described in further detail below.

Figure 3B:
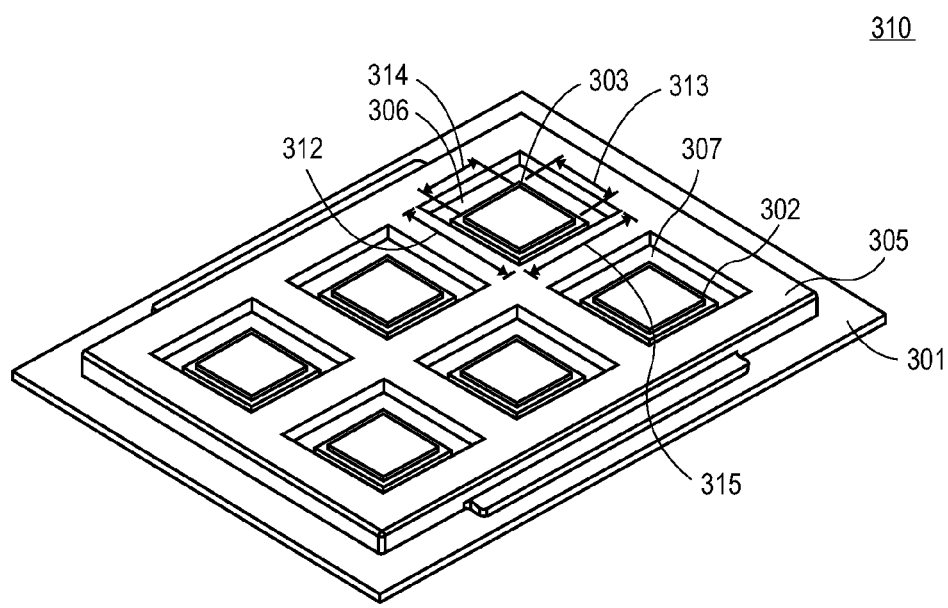
FIG. 3B shows a view similar to FIG. 3A after a stiffener plate is installed according to one embodiment.

FIG. 3B shows a view 310 similar to FIG. 3A after a stiffener plate having the openings is installed over the components on the substrate according to one embodiment. As shown in FIG. 3B, a stiffener plate 305 has openings, such as an opening 306 and an opening 307 to expose the components, such as component 303 and component 302. In at least some embodiments, forming the openings includes mechanically cutting the openings in the stiffener plate by a laser beam, as known to one of ordinary skill in the art. The opening, such as opening 306 in the stiffener plate can have a square, rectangular, round, oval, or any other shape to expose an underlying component, such as component 303. The size of the opening in the stiffener plate is greater than the size of the underlying component. As shown in FIG. 3B, a width 315 and a length 312 of the opening 306 are greater than a width 314 and a length 313 of the component 303. In at least some embodiments, the size of the openings is about 1 mm to 5 mm greater than the size of the underlying component. In one embodiment, the area size of the component is "A×B", where A is from about 2 mm to about 40 mm and B is from about 2 mm to about 40 mm. In one embodiment, the opening in the stiffener plate is centered over the component. In at least one embodiment, the thickness of the stiffener plate is greater than the heights of the components. In at least some embodiments, the thickness of the stiffener plate is from about 0.5 mm to about 3 mm.

Referring back to FIG. 2, method 200 continues with operation 202 that involves depositing a first level thermal interface material (TIM1) layer on each of the components. The thermal interface material are typically high thermal conductivity materials that become liquidous or near-liquidous at predetermined operating temperatures. The TIMs can flow and fill surface asperities enabling reductions in thermal resistance between two contacting surfaces. The TIM1 can be, for example a metal based TIM, a polymer matrix TIM, thermal grease or any other TIM1 material layer. The TIM1 layer can be, for example, a metallic alloy with a low melting point. The TIM1 layer can be, for example, a solder thermal interface material ("STIM"), such as an indium solder TIM. In one embodiment, the TIM1 is 99.99% indium solder.

In one embodiment, the TIM1 layer is a metal based alloy layer, including, for example, Indium (In), tin (Sn), lead (Pb), silver (Ag), antimony (Sb), Bismuth (Bi), zinc (Zn), Cadmium (Cd), gold (Au), copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), platinum Pt, or any combination thereof.

In at least some embodiments, the TIM1 layer is deposited separately on each of the components, as described in further detail with respect to FIG. 4. In at least some embodiments, the TIM1 layer has a minimum thickness for all the components. In at least some embodiments, the minimum thickness of the TIM1 layer is less than 50 microns ("μm"). In at least some embodiments, the thickness of the TIM1 layer is from about 20 μm to about 50 μm. In at least some embodiments, the TIM1 layer is a TIM1 preform that has a predetermined shape adjusted to a shape of the die. The TIM1 preform can be placed on the top surface of the component using, for example, a vacuum tool. The TIM1 preform can be manufactured using one of techniques known to one of ordinary skill in the art of electronic device manufacturing, for example, by stamping. In one embodiment, the TIM1 preform is placed on the die using a vacuum tool known to one of ordinary skill in the art of electronic device manufacturing.

At operation 203 a plurality of individual integrated heat spreaders (slugs) are deposited on the first thermal interface layer over the components within the openings in the stiffener plate. In at least some embodiments, the individual integrated heat spreaders deposited over the components have different thicknesses to compensate for the difference between the heights of the die components. In at least some embodiments, to compensate for the difference between the heights of the die components, the individual integrated heat spreaders are thicker over the die components that are smaller in height. In one embodiment, the nominal difference in stack heights between die components is adjusted for by selecting individual IHSs having corresponding thicknesses to be deposited onto individual die blocks, as described in further detail below. That is, the die stacks having different heights can be accommodated in the MC package by adjusting the thicknesses of the individual IHSs to be deposited onto individual die blocks, as described in further detail below.

In at least some embodiments, an individual integrated heat spreader is a copper plate, aluminum plate, any other highly thermally conductive material plate, or a combination thereof. In at least some embodiments, the individual integrated heat spreader has an area size adjusted to the size of the component. The individual integrated heat spreader acts as a first heat exchanger that moves heat between a heat source (e.g., a component) and a secondary heat exchanger (a heat sink) whose larger surface area and geometry are more adapted to remove overall heat from the MC electronic device package. The heat produced by a heat source (e.g., a component) (is "spread out" by the individual integrated heat spreader allowing the secondary heat exchanger to increase the heat capacity of the package assembly.

Figure 3C:
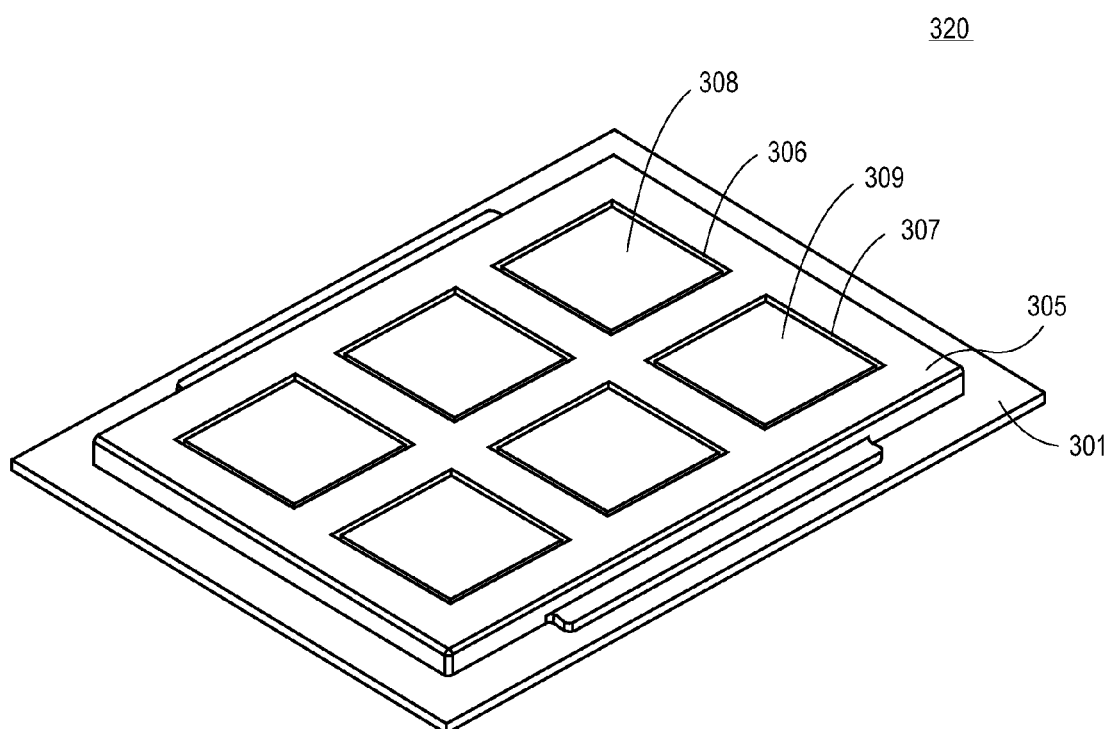
FIG. 3C shows a view similar to FIG. 3B after individual integrated heat spreaders are installed.

FIG. 3C shows a view 320 similar to FIG. 3B after individual integrated heat spreaders are installed through the openings in the stiffener plate over the components according to one embodiment. As shown in FIG. 3C, individual integrated heat spreaders (IHS), such as an individual IHS 308 and an individual IHS 309 are installed through the openings, such as opening 306 and 307 in the stiffener plate 305 on to the corresponding components, such as components 303 and 302 shown in FIGS. 3A and 3B. In at least some embodiments, an individual IHS, such as IHS 308 is deposited through an opening in the stiffener plate, such as opening 306 on the TIM1 material (not shown) on the corresponding component, such as component 303 shown in FIGS. 3A and 3B. In at least some embodiments, the individual IHS is placed on top of the TIM1 material on the component using a placement tool known to one of ordinary skill in the art of electronic device manufacturing. In at least some embodiments, the thickness of the individual IHS is adjusted to compensate for the difference in height between the components, as described in further detail below. As shown in FIG. 3C, the thickness of the stiffener plate is greater than the thicknesses of each of the components and individual integrated heat spreaders.

Referring back to FIG. 2, method 200 at an operation 204 a second level thermal interface material layer (TIM2) is deposited on the individual integrated heat spreaders. Depositing the TIM2 layer to the individual integrated heat spreaders is described in further details with respect to FIGS. 4-10. In at least one embodiment, the TIM2 layer is thicker over the components that are smaller in height to compensate for a height difference of the components. In at least some embodiments, the thickness of the TIM2 layer is greater than 50 μm. In at least some embodiments, the thickness of the TIM2 layer is from about 50 μm to about 250 μm.

The TIM2 layer is applied onto each of the individual integrated heat spreaders using one of the TIM2 layer deposition techniques known to one of ordinary skill in the art of electronic device manufacturing. In at least some embodiments, the TIM2 layer is applied onto heatsink base instead using one of the TIM2 layer deposition techniques known to one of ordinary skill in the art of electronic device manufacturing. In at least some embodiments, the individual integrated heat spreaders, such as an IHS 308 and an IHS 309 shown in FIG. 3C are configured to be attached to a heat sink via the TIM2 layer. The TIM2 layer is applied between the individual integrated heat spreaders and the heat sink to increase a thermal throughput for the MC package. The TIM2 can be, for example a metal based TIM, a polymer based TIM, or any other TIM2 material layer. For example, the TIM2 layer can be a thermally conductive grease or other material that includes, e.g., colloidal silver. For example, the TIM2 layer can be ShinEtsu G751, Chomerics T777, Honeywell PCM45F, Dow Corning 5026, Bergquist HF3000 mm, or any other TIM2 material known to one of ordinary skill in the art of electronic device manufacturing. In one embodiment, the TIM2 layer is a metallic alloy with a low melting point. In one embodiment, the TIM2 layer is a solder thermal interface material ("STIM"), such as an indium solder TIM. In one embodiment, the TIM2 is a 99.99% indium solder.

In one embodiment, the TIM2 layer is a metal based alloy layer, including, for example, Indium (In), tin (Sn), lead (Pb), silver (Ag), antimony (Sb), Bismuth (Bi), zinc (Zn), Cadmium (Cd), gold (Au), copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), platinum Pt, or any combination thereof. In at least some embodiments, the TIM2 layer is deposited separately on each of the individual integrated heat spreaders using one of the TIM2 deposition techniques known to one of ordinary skill in the art of electronic device manufacturing. In at least some embodiments, the TIM2 layer is applied separately on each of the individual integrated heat spreaders by a precalibrated grease dispenser.

At operation 205 a heat sink is installed on the second thermal interface material layer. The heat sink dissipates heat further away from the components connected to the individual integrated heat spreaders through for example, conduction, convection, and/or radiation. A thermal mass of the heat sink is typically greater than the thermal mass of the components and the individual integrated heat spreaders. The heat sink is typically made of a high thermally conductive material, e.g., a metal, e.g., copper, aluminum, other thermally conductive metals, or any combination thereof. In one embodiment, a thermal interface material, and any other adhesive used to assembly the electronic device structure are baked in an oven to adhere to the components, the individual integrated heat spreaders, heat sink, and stiffener plate. In at least some embodiments, the baking temperature is from about 150° C. to about 200° C.

FIG. 4 is a cross-sectional view 400 of a MC package having multiple individual integrated heat spreaders over components having same nominal height according to one embodiment. As shown in FIG. 4, the components, e.g., a component 409 and a component 408 are deposited on a substrate 401, as described above. Components 408 and 409 have the same nominal height. In one embodiment, the components, such as components 408 and 409, include a memory, a processor, a Graphics Processing Unit (GPU), a Platform Controller Hub (PCH), a Peripheral Component Interconnect (PCI), an on-chip system fabric, a network interface controller, a stacked component, a non-stacked component, a ball grid array (BGA) package, any other electronic component, or any combination thereof. In one embodiment, the components, such as components 408 and 409 include a die. In one embodiment, each of the components is a die block, as described above. The components deposited on the substrate 401 can be any of the components described above with respect to FIGS. 2, 3A-3C. As shown in FIG. 4, components 408 and 409 are attached to the substrate via BGA assemblies, such as a BGA substrate 411 and a BGA substrate 412. As shown in FIG. 4, a stiffener plate 402 having openings, such as an opening 414 and an opening 417 is attached to substrate 401, as described above. In one embodiment, an insulating layer, such as insulating layer 415 (e.g., an interlayer dielectric) is deposited on substrate 401 to isolate the components from each other. As shown in FIG. 4, a TIM1 layer, such as a TIM1 layer 407 is deposited on top of each of the components, as described above. In one embodiment, the TIM1 layer has a minimum thickness for all components on the substrate 401, as described above.

A plurality of individual integrated heat spreaders, such as an individual IHS 406 are deposited on the minimized TIM1 layer through the openings in the stiffener plate, as described above. An enlarged portion of the component 408 within opening 417 is presented in an insert 403. As shown in the insert 403, component 408 includes a stack of dies having various thicknesses. Due to natural variation in the die thicknesses the heights of the components can vary. Generally, due to natural variation in the thickness of the dies, greater the die stack, greater the height variation between the die stacks. In one embodiment, the components having smaller heights receive thicker individual integrated heat spreaders to compensate for the height difference. This ensures that nominally all individual IHSs have the height that matches up with the nominal height of the stiffener plate having the openings, such as stiffener plate 402. This way all die blocks get a thinnest TIM1. In one embodiment, the height of the component 408 is smaller than the height of component 409 due to natural variation in die heights, and the individual IHS deposited onto the component 408 is thicker than the individual IHS deposited onto component 409. In one embodiment, a difference in thickness between the individual IHSs is from about 0.1 mm to about 2 mm. This ensures that the top surfaces of all individual IHSs, such as individual IHS 406 and individual IHS 419 are substantially matched with a top surface of the stiffener plate, such as plate 402 to avoid an air gaps between the individual IHSs and the heat sink, such as heat sink 405. In one embodiment, the thickness of the stiffener plate is greater than the heights of the components.

A TIM2 layer, for example, a TIM2 layer 404 and a TIM2 layer 413 is deposited on the individual integrated heat spreaders within openings, as described above. In one embodiment, the thickness of the TIM2 is adjusted to compensate for the difference in height between the components. In one embodiment, the height of the component 408 is smaller than the height of component 409 due to natural variation in die heights, and the thickness of the TIM2 layer 404 deposited onto the component 408 is greater than the thickness of the TIM2 layer 413 deposited onto component 409. As shown in FIG. 4, a heat sink 405 is attached to the TIM2 layer over the individual integrated heat spreaders, as described above. As shown in FIG. 4, heat sink 405 includes a flat surface to ensure a thermal contact with the individual integrated heat spreaders, such as IHS 419 and 406 via TIM2 413 and TIM2 404 respectively. In one embodiment, heat sink 405 includes an array of comb or fin like protrusions (not shown) to increase the surface contact with the air that may increase the rate of the heat dissipation. The heat sink may be coupled to a fan (not shown) to increase the rate of airflow over the heat sink.

FIG. 5 is a cross-sectional view 500 of a MC package having multiple individual integrated heat spreaders over components having different nominal heights according to one embodiment. As shown in FIG. 5, the components, e.g., a component 503 and a component 504 are deposited on a substrate 501, as described above. Components 503 and 504 have different nominal height. As shown in FIG. 5, component 504 is a die block mounted on a substrate 501 via a BGA assembly 505. Component 503 is a die block directly attached to substrate 501. The nominal height of component 504 is greater than the nominal height of the component 503. The components deposited on the substrate 501 can be any of the components as described above. As shown in FIG. 5, a stiffener plate 502 having the openings is attached to substrate 501, as described above. As shown in FIG. 5, a TIM1 layer, such as a TIM1 layer 512 is deposited on top of each of the components, as described above. In one embodiment, the TIM1 layer has a minimum thickness for all components on the substrate 501, as described above.

A plurality of individual integrated heat spreaders, such as an individual IHS 506 and an individual IHS 507 are deposited on the minimized TIM1 layer through the openings in the stiffener plate 502, as described above. In one embodiment, the components having smaller heights, such as component 503 receive thicker individual integrated heat spreaders, such as IHS 506 to compensate for the height difference. This way all die blocks get a thinnest TIM1. This ensures that the top surfaces of all individual IHSs, such as individual IHS 506 and individual IHS 507 are substantially matched with a top surface of the stiffener plate, such as plate 502, and any air gaps between the individual IHSs and the heat sink, such as a heat sink 510 are avoided. In one embodiment, a difference in thickness between the individual IHSs is from about 0.1 mm to about 2 mm.

A TIM2 layer, for example, a TIM2 layer 509 and a TIM2 layer 508 is deposited on the individual integrated heat spreaders within openings, as described above. In one embodiment, the thickness of the TIM2 is adjusted to compensate for the difference in nominal height between the components. In one embodiment, a component having a smaller height, such as component 503 receives a thicker TIM2 layer than the component having a greater height that receives a thinner TIM2 layer to compensate for the height difference. As shown in FIG. 5, heat sink 510 is attached to the TIM2 layer over the individual integrated heat spreaders, as described above.

Figure 7A:
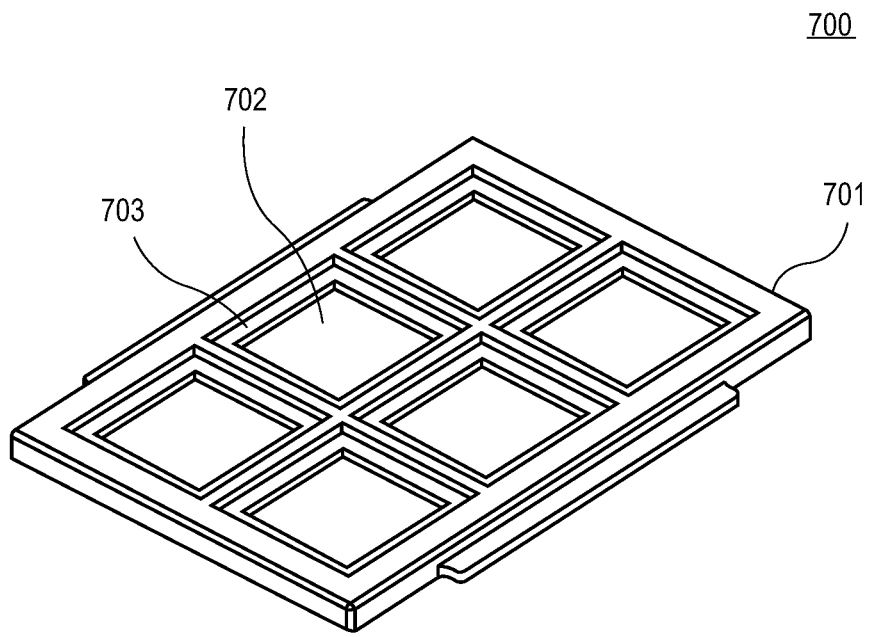
FIG. 7A shows a top view of a stiffener plate according to one embodiment.

FIG. 7A shows a top view 700 of a stiffener plate having openings with a recess according to one embodiment. A stiffener plate 701 has openings, such as an opening 702, as shown in FIG. 7A. The recess is formed along the sidewalls of each of the openings around a die location to fix each individual IHS inserted into the opening on the stiffener plate and package. As shown in FIG. 7A each opening has a recess, such as a recess 703 along the sidewalls of the opening to place the individual IHS. In one embodiment, a sealant/adhesive is applied onto the surface of the recess to secure the individual IHS on the stiffener plate, as described in further detail below. In one embodiment, the stiffener plate recess acts as a vertical stop to keep the individual IHS from damaging the die when a load is applied, as described in further detail below. The recesses along the sidewalls of the openings in the stiffener plate can be formed for example, by laser drilling, mechanically cutting, etching, forging, stamping, die casting or any other stiffener plate cutting techniques known to one of ordinary skill in the art of electronic device manufacturing.

Figure 7B:
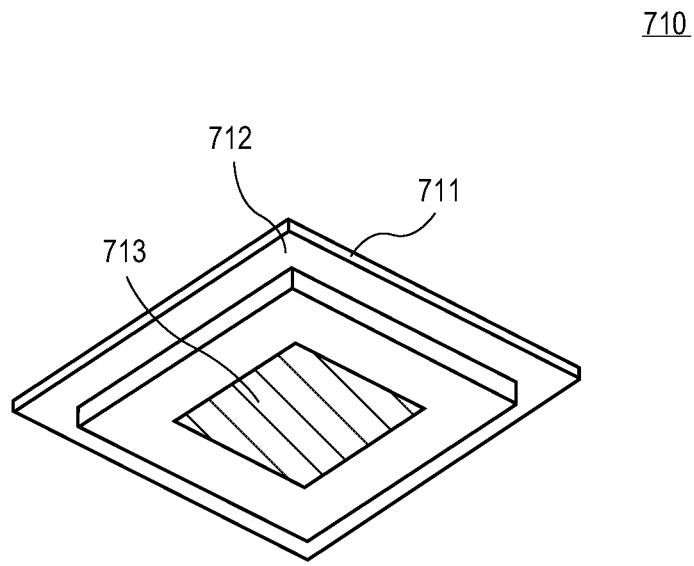
FIG. 7B shows a bottom view of an individual integrated heat spreader according to one embodiment.

FIG. 7B shows a bottom view 710 of an individual integrated heat spreader (HS) 711 having a step 712 according to one embodiment. As shown in FIG. 7B, step 712 is formed along a perimeter of the IHS 711. Step 712 surrounds a TIM1 contact area 713. The step along the perimeter of the IHS can be formed for example, by laser drilling, mechanically cutting, etching, forging, stamping, die casting or any other heat spreader cutting techniques known to one of ordinary skill in the art of electronic device manufacturing.

Figure 8:
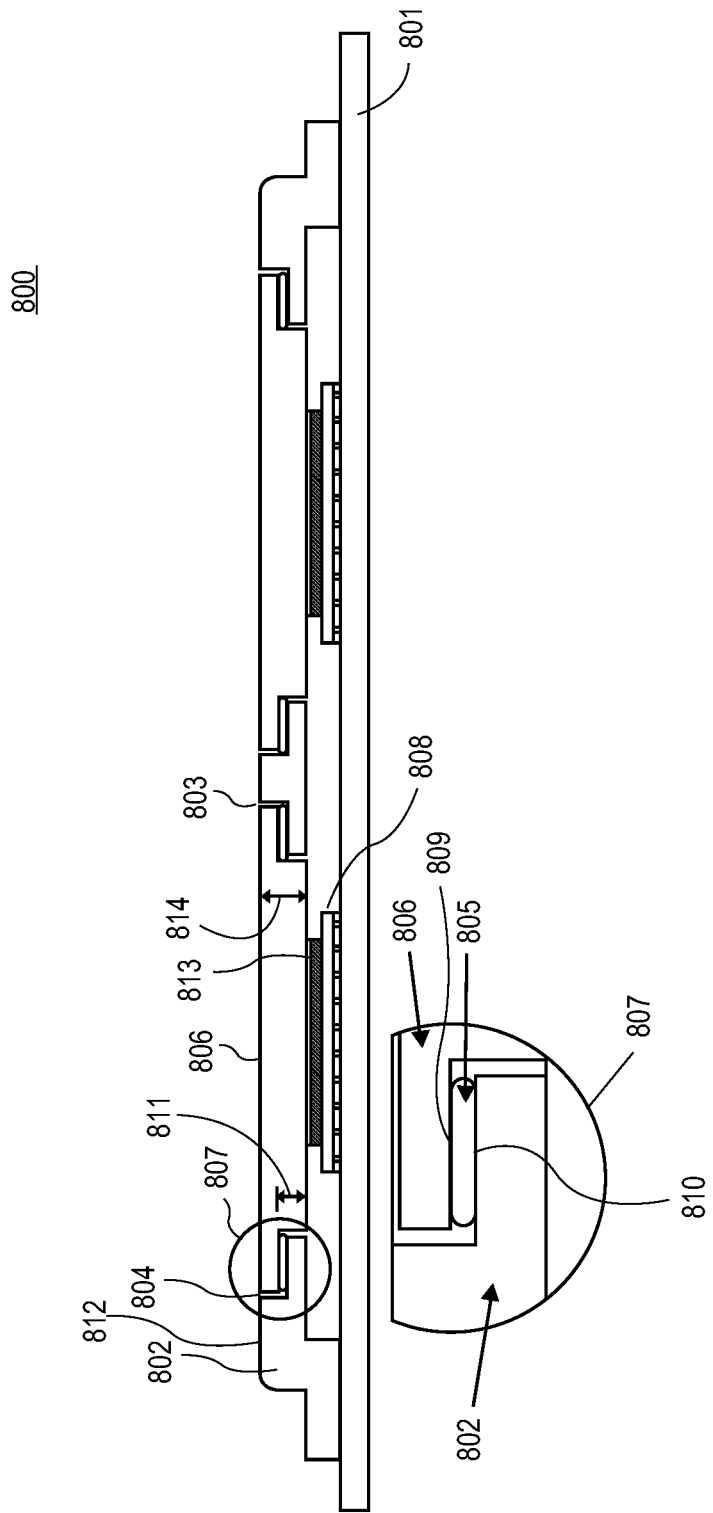
FIG. 8 shows a cross-sectional view of an assembly to secure individual integrated heat spreaders according to one embodiment.

FIG. 8 shows a cross-sectional view of an assembly 800 having a sealant to secure individual integrated heat spreaders to a stiffener plate according to one embodiment. As shown in FIG. 8, the die components, such as a die component 808 are formed on a substrate 801, as described above. As shown in FIG. 8, a stiffener plate 802 having openings, such as an opening 803 is deposited on a substrate 801 over the components, as described above. In one embodiment, an adhesive is applied to the substrate along the perimeter of the stiffener plate to secure the stiffener plate on the substrate. The adhesive can be one of the thermal interface materials for the integrated heat spreader known to one of ordinary skill in the art of electronic device manufacturing. As shown in FIG. 8, individual integrated heat spreaders, such as an individual IHS 806, are inserted into the openings in the stiffener plate 802 and are attached to the components, such as component 808, via a TIM1, as described above.

An enlarged portion of the assembly 800 is shown in an insert 807. As shown in insert 807, a portion of a step 809 of the individual IHS 806 is placed on a top surface of a recess 810 formed along a sidewall of the opening 803 in the stiffener plate 802. A sealant 805 is applied between the top surface of the recess and step 809. The sealant formed between the recess in the opening and the step of the individual integrated heat spreader, such as sealant 805 is used to make the individual integrated heat spreader immovable from the stiffener plate and MC package. Additionally, the sealant is formed between the recess in the opening and the step of the individual integrated heat spreader to protect the die and to keep foreign objects (e.g., dust, liquids, TIM2) from entering the die package. Stiffener plate recess 810 acts as a vertical stop to keep the individual IHS 806 from damaging the die component 808 when the stiffener plate 802 is under a load.

Figure 6:
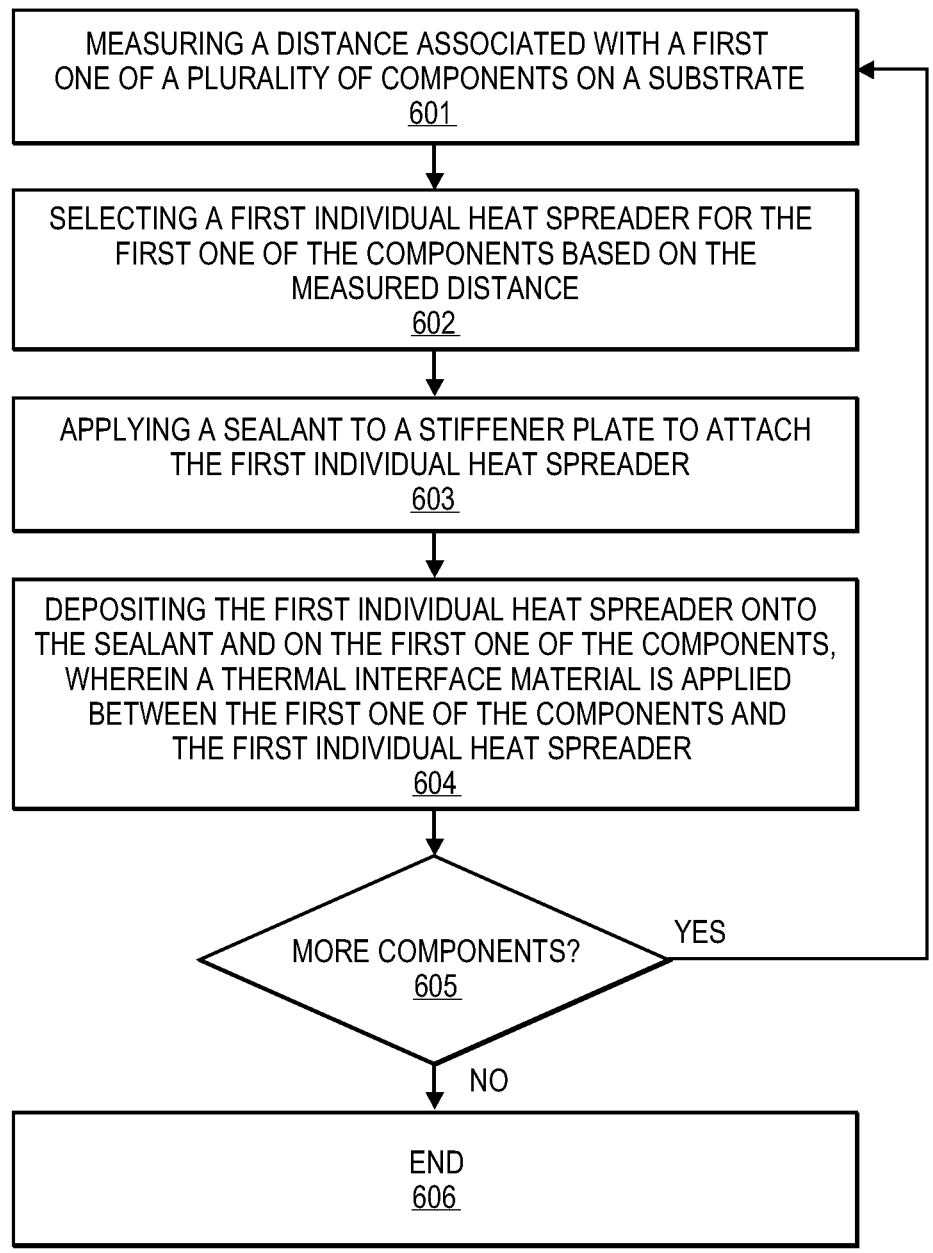
FIG. 6 shows a flowchart of a method to install individual integrated heat spreaders according to one embodiment.

FIG. 6 shows a flowchart of a method 600 to install individual integrated heat spreaders into openings in a stiffener plate according to one embodiment. Method 600 begins with operation 601 that involves measuring a distance associated with a first one of a plurality of components on a substrate. The distance is measured to select an individual integrated heat spreader that has an appropriate thickness to adjust for the height of the die component, as described above. In at least some embodiments, for a given package, sizes of the components are determined based on a design. In at least some embodiments, the sizes of the IHSs, such as a length, and a width, and a thickness are determined based in the sizes (e.g., a length, a width, and a height) of the components prior to an assembly process. In at least some embodiments, the IHS having predetermined sizes are made prior to an assembly process. In at least some embodiments, for each opening over a component, the IHS having a predetermined size is selected during the assembly process. In at least some embodiments, the IHSs having a predetermined length and width ("A×B") are provided in different thicknesses to pair with height variation in the components.

Referring back to FIG. 8, in one embodiment, a vertical distance from the stiffener plate recess surface to the top of a die component, such as a distance 811, is measured. In one embodiment, a vertical distance from a top of the stiffener plate 812 to a top of the die component 813 is measured to select the appropriate individual IHS thickness. In one embodiment, the distance is measured optically on the fly using an optical technique known to one of ordinary skill in the art of electronic device manufacturing. In one embodiment, during the assembly process, the stack height on each die component is measured using an optical technique known to one of ordinary skill in the art of electronic device manufacturing.

Method 600 continues with operation 602 that involves selecting a first individual integrated heat spreader for the first one of the component based on the measured distance. As shown in FIG. 8, the selected individual IHS has a height 814 that adjusts for the height of the die component 808 and the TIM1 layer applied to the top surface which the IHS 808. Based on the measured height, the IHS having a particular thickness is selected from pre-fabricated IHS designs of different thicknesses. In one embodiment, the thickness of the individual IHS is selected such that sum of the component height and the IHS thickness relative to a substrate, such as substrate 801, is as close as possible to a target height, but is not greater than the target height. In one embodiment, the target height is the height of the top surface of the stiffener plate relative to the substrate. In one embodiment, a total height of the selected IHS connected to the die component via the TIM1 relative to a substrate, such as substrate 801 does not exceed the height of the stiffener plate 802 relative to the substrate. In one embodiment, a total height of the selected IHS connected to the die component via the TIM1 substantially matches the thickness of the stiffener plate.

Referring back to FIG. 6, at operation 603, a sealant is applied to a stiffener plate to attach the first individual integrated heat spreader, as described above. At operation 604, the first individual integrated heat spreader is deposited onto the sealant and on the first one of the components.

The individual IHS is then placed with the step contacting the sealant and the bottom surface resting on the TIM1 applied to the first one of the components, as described above. At operation 605 it is determined, if there are more die components on a substrate for a heat spreader? If there are more components on the substrate, method 600 returns to operation 601. If there are no more components on the substrate that need a heat spreader, method 600 ends at 606. In one embodiment, after individual IHS pieces are installed, clips are used to hold IHS pieces on to the die blocks. For metallic TIM1 materials, e.g., Indium solder TIM, the assembly is then sent to a bake oven to melt and adhere TIM1 to the die and the individual IHS. In a possible alternate assembly process, all IHS slugs could be assembled concurrently.

If the components on the package substrate are 3D-stacked die packages, there can be significant stack height variation. In one embodiment, to enhance thermal performance thicker IHS is installed on a die block that is shorter in height. This minimizes TIM1 thickness, and result in thinner TIM2 bond line thickness.

Figure 9:
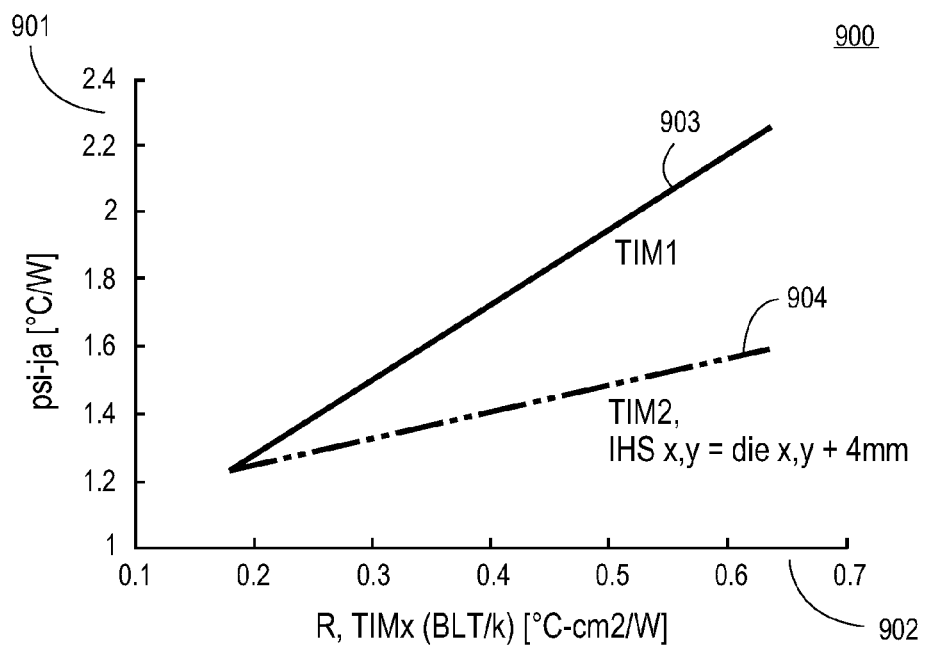
FIG. 9 shows an exemplary graph showing a sensitivity of a thermal resistance according to one embodiment.

FIG. 9 shows an exemplary graph 900 showing a sensitivity of a thermal resistance to a thermal interface material performance at various layers for a non-uniform silicon powermap according to one embodiment. As shown in FIG. 9, a thermal resistance (psi-ja) 901 against a thermal interface material resistance (R, TIMx) 902 at a TIM1 layer and at a TIM2 layer for a highly non-uniform silicon powermap (e.g., an electronic device component). Thermal resistance psi-ja 901 is represented by a ratio of a difference between a junction temperature and an ambient temperature to a power applied to an electronic component. As shown in FIG. 8, thermal interface material resistance 902 is represented by a ratio of a bond line thickness (BLT) to a conductivity of the material ("effective thickness"). Larger slope typically occurs where powermap is more non-uniform and indicates that thermal resistance of the component is more sensitive to the TIM performance at that layer. As shown in FIG. 9, a slope 903 is larger than a slope 904 that indicates that the thermal resistance is more sensitive to TIM resistance in TIM1 layer than in TIM2 layer. FIG. 9 shows how psi-ja changes with TIMI and TIM2 thermal performance. It is clear that the overall thermal resistance (psi-ja) has larger sensitivity to the TIM1 resistance than to the TIM2 resistance. In other words, the thermal resistance for the component has larger sensitivity to the effective thickness in TIM1 layer than in TIM2 layer. That is, greater thermal performance improvement can be achieved by minimizing the thickness of the TIM1 layer for each of the components.

Figure 10:
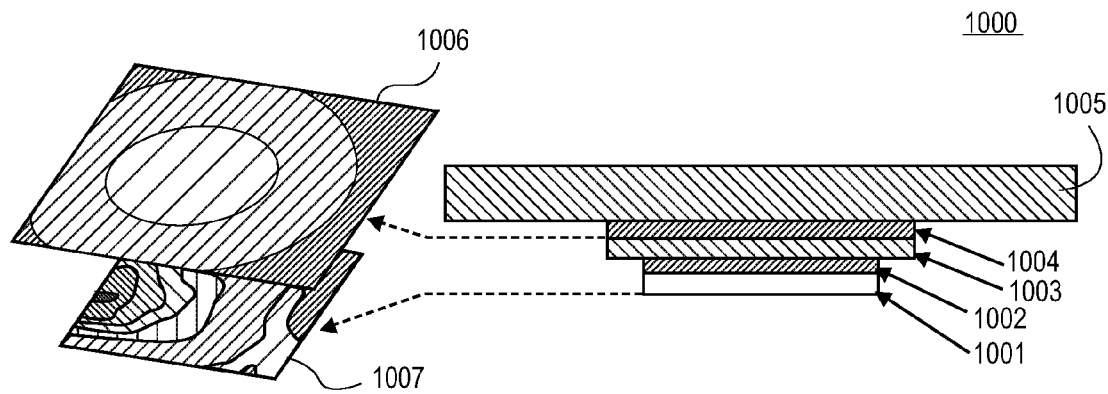
FIG. 10 shows an exemplary graph illustrating a temperature distribution for an electronic device component according to one embodiment.

FIG. 10 shows an exemplary graph illustrating a temperature distribution near a TIM1 layer and near a TIM2 layer for an electronic device component according to one embodiment. As shown in FIG. 10, an electronic device component has a TIM1 layer 1002 between a die 1001 and an individual IHS slug 1003, and a TIM2 layer 1004 between a heat sink 1005 and other side of the IHS slug 1003, as described herein. As shown in FIG. 10, a distribution of temperature near TIM2 layer 1006 is more uniform than a distribution of temperature near TIM1 layer 1007. That is, the temperature distribution is more sensitive to the performance in the TIM1 layer than in the TIM2 layer and greater temperature performance improvement can be achieved by minimizing the thickness of the TIM1 layer for each of the components. In one embodiment, an electronic device component has a heat source (powermap) at the bottom side of the die. In one embodiment, the thickness of the IHS slug, such as slug 1003 is about 2 mm. In one embodiment, the area of the IHS slug is bigger than the die area by 4 mm in each direction. This provides additional 2 mm space along the perimeter of the die allowing additional heat spreading.

An advantage of at least one embodiment of the integrated heat spreader design as described is that it minimizes the TIM1 thickness for the components and moves component height variation impact away to upper layer (e.g., TIM2 layer). The thermal performance of the MC package is improved, as it is less sensitive to the TIM2 performance, as described herein. In at least one embodiment, the thermal performance of the MC package incorporating the embodiments described herein is improved by at least 30% relative to the existing MC packages. An advantage of at least one embodiment of the integrated heat spreader design as described herein is that nominal stack height differences between die blocks on the same package are easily accommodated. This is accomplished by using smaller IHSs of different height to compensate for nominal height differences.

At least one embodiment of the integrated heat spreader design as described herein allows transferring the heatsink load through the stiffener plate to the package and to the socket. If the die blocks on the package have low load carrying capacity, the smaller IHSs can be designed to sit just below the stiffener plate. This ensures that heat sink/socket load is not transferred to the package through the die blocks. Further, in at least one embodiment of the integrated heat spreader design as described herein die cracking issues are avoided.

The embodiments described herein address a thermal challenge at a package level. If the thermal challenge is not addressed, this can lead to lowering of power levels that may result in reduced performance, shift the temperature challenge burden to other platforms, and use advanced cooling solutions leading to increased cost. Embodiments as described herein reduce cooling cost of the electronic device systems.

Figure 11:
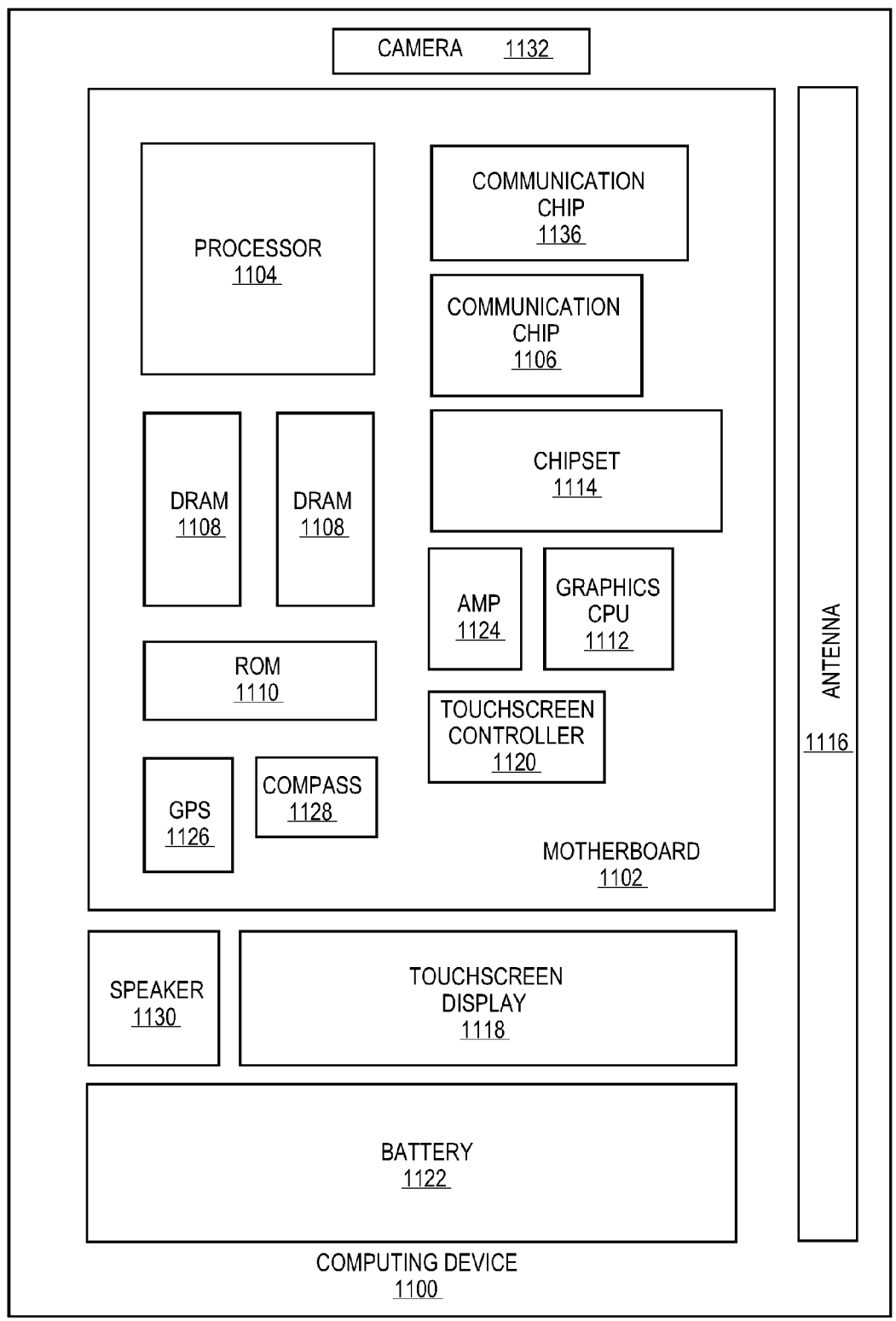
FIG. 11 illustrates a computing device in accordance with one embodiment.

FIG. 11 illustrates a computing device 1100 in accordance with one embodiment. The computing device 1100 houses a board 1102. The board 1102 may include a number of components, including but not limited to a processor 1104 and at least one communication chip 1106. The processor 1104 is physically and electrically coupled to the board 1102. In some implementations at least one communication chip is also physically and electrically coupled to the board 1102. In further implementations, at least one communication chip 1106 is part of the processor 1104.

Depending on its application, computing device 1100 may include other components that may or may not be physically and electrically coupled to the board 1102. These other components include, but are not limited to, a memory, such as a volatile memory 1108 (e.g., a DRAM), a non-volatile memory 1110 (e.g., ROM), a flash memory, a graphics processor 1112, a digital signal processor (not shown), a crypto processor (not shown), a chipset 1114, an antenna 1116, a display, e.g., a touchscreen display 1118, a display controller, e.g., a touchscreen controller 1120, a battery 1122, an audio codec (not shown), a video codec (not shown), an amplifier, e.g., a power amplifier 1124, a global positioning system (GPS) device 1126, a compass 1128, an accelerometer (not shown), a gyroscope (not shown), a speaker 1130, a camera 1132, and a mass storage device (such as hard disk drive, compact disk (CD), digital versatile disk (DVD), and so forth) (not shown).

A communication chip 1106, e.g., communication chip 1106, enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips. For instance, a communication chip 1106 may be dedicated to shorter range wireless communications such as Wi-Fi and Bluetooth and a communication chip 1136 may be dedicated to longer range wireless communications such as GPS, EDGE, GPRS, CDMA, WiMAX, LTE, Ev-DO, and others.

In at least some embodiments, the processor 1104 of the computing device 1100 includes an integrated circuit die packaged with an integrated heat spreader design that maximizes heat transfer from a multi-chip package as described herein. The integrated circuit die of the processor includes one or more devices, such as transistors or metal interconnects as described herein. The term "processor" may refer to any device or portion of a device that processes electronic data from registers and/or memory to transform that electronic data into other electronic data that may be stored in registers and/or memory.

The communication chip 1006 also includes an integrated circuit die package an integrated heat spreader design that maximizes heat transfer from a multi-chip package according to the embodiments described herein.

In further implementations, another component housed within the computing device 1000 may contain an integrated circuit die package having an integrated heat spreader design that maximizes heat transfer from a multi-chip package according to embodiments described herein.

In accordance with one implementation, the integrated circuit die of the communication chip includes one or more devices, such as transistors and metal interconnects, as described herein. In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

The following examples pertain to further embodiments:

An electronic package, comprising a plurality of components on a substrate a stiffener plate over the components, wherein the stiffener plate has openings to expose the components; and a plurality of individual integrated heat spreaders within the openings over the components.

An electronic package, comprising a plurality of components on a substrate; a stiffener plate over the components, wherein the stiffener plate has openings to expose the components; and a plurality of individual integrated heat spreaders within the openings over the components, and a first thermal interface material layer between the components and the individual integrated heat spreaders, wherein the first thermal interface material layer has a thickness which is minimized for the components.

An electronic package, comprising a plurality of components on a substrate; a stiffener plate over the components, wherein the stiffener plate has openings to expose the components; and a plurality of individual integrated heat spreaders within the openings over the components, wherein the individual integrated heat spreaders are thicker over the components that are smaller in height.

An electronic package, comprising a plurality of components on a substrate; a stiffener plate over the components, wherein the stiffener plate has openings to expose the components; and a plurality of individual integrated heat spreaders within the openings over the components, and a second thermal interface material layer on the individual integrated heat spreaders, wherein the second thermal interface material layer is thicker over the components that are smaller in height; and a heat sink on the second thermal interface material layer.

An electronic package, comprising a plurality of components on a substrate; a stiffener plate over the components, wherein the stiffener plate has openings to expose the components; and a plurality of individual integrated heat spreaders within the openings over the components, wherein the components include a memory, a processor, a Graphics Processing Unit (GPU), a Platform Controller Hub (PCH), a Peripheral Component Interconnect (PCI), an on-chip system fabric, a network interface controller, a stacked component, a non-stacked component, a ball grid array (BGA) package, or any combination thereof.

An electronic package, comprising a plurality of components on a substrate; a stiffener plate over the components, wherein the stiffener plate has openings to expose the components; and a plurality of individual integrated heat spreaders within the openings over the components, wherein the openings have a recess.

A multi-chip package, comprising a substrate; a plurality of die components on the substrate; a first thermal interface material layer on the die components; and a plurality of individual integrated heat spreaders on the first thermal interface material layer, wherein the individual integrated heat spreaders are thicker over the die components that are smaller in height.

A multi-chip package, comprising a substrate; a plurality of die components on the substrate; a first thermal interface material layer on the die components; and a plurality of individual integrated heat spreaders on the first thermal interface material layer, wherein the individual integrated heat spreaders are thicker over the die components that are smaller in height; and a stiffener plate having openings over the die components, wherein the individual integrated heat spreaders are positioned within the openings.

A multi-chip package, comprising a substrate; a plurality of die components on the substrate; a first thermal interface material layer on the die components; and a plurality of individual integrated heat spreaders on the first thermal interface material layer, wherein the individual integrated heat spreaders are thicker over the die components that are smaller in height, wherein the first thermal interface material layer has a thickness that is minimized for the die components.

A multi-chip package, comprising a substrate; a plurality of die components on the substrate; a first thermal interface material layer on the die components; and a plurality of individual integrated heat spreaders on the first thermal interface material layer, wherein the individual integrated heat spreaders are thicker over the die components that are smaller in height, a second thermal interface material layer on the individual integrated heat spreaders; and a heat sink on the second thermal interface material layer.

A multi-chip package, comprising a substrate; a plurality of die components on the substrate; a first thermal interface material layer on the die components; and a plurality of individual integrated heat spreaders on the first thermal interface material layer, wherein the individual integrated heat spreaders are thicker over the die components that are smaller in height, wherein the die components include a memory, a processor, a Graphics Processing Unit (GPU), a Platform Controller Hub (PCH), a Peripheral Component Interconnect (PCI), on-chip system fabric, a network interface controller, a stacked component, a non-stacked component, a ball grid array (BGA) package, or any combination thereof.

A multi-chip package, comprising a substrate; a plurality of die components on the substrate; a first thermal interface material layer on the die components; and a plurality of individual integrated heat spreaders on the first thermal interface material layer, wherein the individual integrated heat spreaders are thicker over the die components that are smaller in height, wherein the individual integrated heat spreaders have a step to attach to a stiffener plate over the die components.

A method to manufacture an electronic package, comprising installing a stiffener plate over the components on a substrate, wherein the stiffener plate has openings; depositing a first thermal interface material layer on the components; and depositing a plurality of individual integrated heat spreaders within the openings on the first thermal interface layer.

A method to manufacture an electronic package, comprising installing a stiffener plate over the components on a substrate, wherein the stiffener plate has openings; depositing a first thermal interface material layer on the components; and depositing a plurality of individual integrated heat spreaders within the openings on the first thermal interface layer, wherein the individual integrated heat spreaders are thicker over the components which are smaller in height.

A method to manufacture an electronic package, comprising forming a stiffener plate over the components on a substrate, wherein the stiffener plate has openings; depositing a first thermal interface material layer on the components; depositing a plurality of individual integrated heat spreaders within the openings on the first thermal interface layer, and minimizing the first thermal interface material layer for the components.

A method to manufacture an electronic package, comprising forming a stiffener plate over the components on a substrate, wherein the stiffener plate has openings; depositing a first thermal interface material layer on the components; depositing a plurality of individual integrated heat spreaders within the openings on the first thermal interface layer; depositing a second thermal interface material layer on the individual integrated heat spreaders; and installing a heat sink on the second thermal interface material layer.

A method to manufacture an electronic package, comprising forming a stiffener plate over the components on a substrate, wherein the stiffener plate has openings; depositing a first thermal interface material layer on the components; depositing a plurality of individual integrated heat spreaders within the openings on the first thermal interface layer; and forming the openings in the stiffener plate to expose the components.

A method to manufacture an electronic package, comprising forming a stiffener plate over the components on a substrate, wherein the stiffener plate has openings; depositing a first thermal interface material layer on the components; and depositing a plurality of individual integrated heat spreaders within the openings on the first thermal interface layer, wherein the depositing the plurality of individual integrated heat spreaders comprises measuring a distance associated with a first one of the components; and selecting a first one of the individual integrated heat spreaders for the first one of the components based on the measured distance.

A method to manufacture an electronic package, comprising forming a stiffener plate over the components on a substrate, wherein the stiffener plate has openings; depositing a first thermal interface material layer on the components; depositing a plurality of individual integrated heat spreaders within the openings on the first thermal interface layer; forming recesses within the openings; forming steps on the individual integrated heat spreaders; and placing the steps on the recesses.

A method to manufacture an electronic package, comprising: forming a stiffener plate over the components on a substrate, wherein the stiffener plate has openings; depositing a first thermal interface material layer on the components; depositing a plurality of individual integrated heat spreaders within the openings on the first thermal interface layer; and baking the first thermal interface material to adhere to the components and the individual integrated heat spreaders.

A method to manufacture an electronic package, comprising: forming a stiffener plate over the components on a substrate, wherein the stiffener plate has openings; depositing a first thermal interface material layer on the components; and depositing a plurality of individual integrated heat spreaders within the openings on the first thermal interface layer, wherein the components include a memory, a processor, a Graphics Processing Unit (GPU), a Platform Controller Hub (PCH), a Peripheral Component Interconnect (PCI), on-chip system fabric, a network interface controller, or any combination thereof.

What is claimed is:

1. An electronic package, comprising:
   a plurality of components comprising a first component and a second component that is thicker than the first component on a substrate;
   a stiffener plate having a first opening over the first component and a second opening over the second component on the substrate; and
   a plurality of individual integrated heat spreaders comprising a first individual integrated heat spreader on the first component within the first opening and a second individual integrated heat spreader on the second component within the second opening, wherein the first individual integrated heat spreader is thicker than the second individual integrated heat spreader.

2. The electronic package of claim 1, further comprising a first thermal interface material layer between the components and the individual integrated heat spreaders, wherein the first thermal interface material layer has a thickness which is minimized for the components.

3. The electronic package of claim 1, wherein the stiffener plate has a thickness that is greater than the thickness of the second component.

4. The electronic package of claim 1, further comprising
   a second thermal interface material layer on the individual integrated heat spreaders, wherein the second thermal interface material layer is thicker over the components that are smaller in height; and
   a heat sink on the second thermal interface material layer.

5. The electronic package of claim 1, wherein the components include a memory, a processor, a Graphics Processing Unit (GPU), a Platform Controller Hub (PCH), a Peripheral Component Interconnect (PCI), an on-chip system fabric, a network interface controller, a stacked component, a non-stacked component, a ball grid array (BGA) package, or any combination thereof.

6. The electronic package of claim 1, wherein the openings have a recess.

7. A multi-chip package, comprising:
a substrate;
a plurality of die components comprising a first die stack and a second die stack that is thicker than the first die stack on the substrate;
a first thermal interface material layer on the die components;
a stiffener plate having a first opening over the first die stack and a second opening over the second die stack on the substrate; and
a plurality of individual integrated heat spreaders on the first thermal interface material layer, wherein the plurality of individual integrated heat spreaders comprise a first individual integrated heat spreader on the first die stack within the first opening and a second individual integrated heat spreader on the second die stack within the second opening, wherein the first individual integrated heat spreader is thicker than the second individual integrated heat spreader.

8. The multi-chip package of claim 7, wherein the stiffener plate has a thickness that is greater than the thickness of the second die stack.

9. The multi-chip package of claim 7, wherein the first thermal interface material layer has a thickness that is minimized for the die components.

10. The multi-chip package of claim 7, further comprising
a second thermal interface material layer on the individual integrated heat spreaders; and
a heat sink on the second thermal interface material layer.

11. The multi-chip package of claim 7, wherein the die components include a memory, a processor, a Graphics Processing Unit (GPU), a Platform Controller Hub (PCH), a Peripheral Component Interconnect (PCI), on-chip system fabric, a network interface controller, a stacked component, a non-stacked component, a ball grid array (BGA) package, or any combination thereof.

12. The multi-chip package of claim 7, wherein the individual integrated heat spreaders have a step to attach to a stiffener plate over the die components.

13. A method to manufacture an electronic package, comprising:
installing a stiffener plate over a first component and a second component that is thicker than the first component on a substrate, wherein the stiffener plate has a first opening over the first component and a second opening over the second component;
depositing a first thermal interface material layer on the components; and
depositing a plurality of individual integrated heat spreaders within the openings on the first thermal interface layer, wherein the plurality of individual integrated heat spreaders comprise a first individual integrated heat spreader on the first component within the first opening and a second individual integrated heat spreader on the second component within the second opening, wherein the first individual integrated heat spreader is thicker than the second individual integrated heat spreader.

14. The method of claim 13, wherein the stiffener plate has a thickness that is greater than the thickness of the second component.

15. The method of claim 13, further comprising
minimizing the first thermal interface material layer for the components.

16. The method of claim 13, further comprising
depositing a second thermal interface material layer on the individual integrated heat spreaders; and
forming a heat sink on the second thermal interface material layer.

17. The method of claim 13, further comprising
forming the openings in the stiffener plate to expose the components.

18. The method of claim 13, wherein the depositing the plurality of individual integrated heat spreaders comprises
measuring a distance associated with a first one of the components; and
selecting a first one of the individual integrated heat spreaders for the first one of the components based on the measured distance.

19. The method of claim 13, further comprising
forming recesses within the openings;
forming steps on the individual integrated heat spreaders; and
placing the steps on the recesses.

20. The method of claim 13, further comprising
baking the first thermal interface material to adhere to the components and the individual integrated heat spreaders.

21. The method of claim 13, wherein the components include a memory, a processor, a Graphics Processing Unit (GPU), a Platform Controller Hub (PCH), a Peripheral Component Interconnect (PCI), on-chip system fabric, a network interface controller, or any combination thereof.

* * * * *